United States Patent
Bergner et al.

(10) Patent No.: US 6,927,172 B2
(45) Date of Patent: Aug. 9, 2005

(54) PROCESS TO SUPPRESS LITHOGRAPHY AT A WAFER EDGE

(75) Inventors: Wolfgang Bergner, Stormville, NY (US); Linda A. Chen, Wappingers Falls, NY (US); Stephan Kudelka, Fishkill, NY (US); Franz X. Zach, Wappingers Falls, NY (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 360 days.

(21) Appl. No.: 10/248,841

(22) Filed: Feb. 24, 2003

(65) Prior Publication Data

US 2004/0166677 A1 Aug. 26, 2004

(51) Int. Cl.⁷ ............................................. H01L 21/302
(52) U.S. Cl. ........................................ 438/706; 438/714
(58) Field of Search ................................ 438/706, 710, 438/714, 719, 720, 723, 724, 725

(56) References Cited

U.S. PATENT DOCUMENTS

| | | | | |
|---|---|---|---|---|
| 5,472,812 A | * | 12/1995 | Sekine | 430/5 |
| 6,033,997 A | * | 3/2000 | Perng | 438/765 |
| 6,132,908 A | * | 10/2000 | Shiraishi et al. | 430/5 |
| 6,291,315 B1 | * | 9/2001 | Nakayama et al. | 438/459 |
| 6,489,249 B1 | * | 12/2002 | Mathad et al. | 438/729 |
| 6,713,236 B2 | * | 3/2004 | Chen | 430/313 |
| 6,806,200 B2 | * | 10/2004 | Dobuzinsky et al. | 438/710 |

* cited by examiner

Primary Examiner—Kin-Chan Chen
(74) Attorney, Agent, or Firm—Todd M. C. Li

(57) ABSTRACT

Damage to the rim of a semiconductor wafer caused by etching processes is reduced by forming a rim of photoresist or other material around the outer edge of the wafer that has a thickness such that images projected on the rim are sufficiently out of focus that they do not develop, so that etching takes place only in the interior.

18 Claims, 3 Drawing Sheets

PROCESS TO SUPPRESS LITHOGRAPHY AT A WAFER EDGE

BACKGROUND OF INVENTION

Technical Field

The field of the invention is that of lithography in integrated circuit processing, in particular in patterning a wafer before an etch step.

In the course of processing integrated circuits, a standard sequence is that of putting down a layer of material, then depositing a layer of photoresist, patterning the photoresist by projecting a pattern on it and developing the resist to produce a pattern of open areas that expose the material, with the other areas still covered by the resist.

The etching process generates heat, so that it is preferred to extend the pattern to the edges of the wafer, even though only a portion of the particular integrated circuit at the edge of the wafer will be present and therefore will not be functional. The reason for this is that performing the etching on the partial chips at the edge tends to spread out the heat produced by the etching more uniformly than if this were not done, thus reducing stress on the wafer and the possibility of distortion.

A drawback of this approach is that, while it accomplishes its primary purpose of reducing stress, it sometimes permits or encourages the formation of closely spaced sets of narrow cracks in the silicon wafer material during trench capacitor etch, referred to as Black silicon. The term black silicon refers to its dark appearance under visible light, caused by a high light absorption of the narrow, spikelike silicon features. The narrow slivers of silicon between the cracks tend to break off during subsequent processing steps, producing particles that cause defects in the integrated circuit, and other problems.

A known approach to avoid 'Black silicon' is the usage of 'shadow rings' in some etching tools. Shadow rings are circular pieces of an etch-resistant material that block the etching process at the edge, as shown in FIG. 8 and discussed later. These tools have potential problems if the shadow ring makes physical contact with the photoresist, which would contaminate the tool and potentially create particles.

In addition, the rings, being mechanical objects, are not positioned as precisely as the lithographic patterns, requiring that space be left as a buffer between the ring position and the closest chip on the wafer. This buffer is required so that all potentially functional chips are properly etched.

The black silicon phenomenon is a problem only very close to the edge of a wafer (3 to 5 mm from the edge of the wafer in current technology). It would be desirable to be able to block the etching in deep trench and other etching steps as required with a controllable pattern that can be aligned with great precision.

SUMMARY OF INVENTION

The invention relates to a method of blocking etching at the edge of a wafer by forming a blocking layer of material that is sufficiently thick that the image of a pattern being projected on the wafer is out of focus.

A feature of the invention is the use of a negative photoresist having a thickness larger than the focus range of the optical stepper projecting the pattern.

Another feature of the invention is the use of an etch-resistant blocking layer.

Another feature of the invention is the formation of a blocking layer having right-angle steps with a distance of closest approach to the wafer edge above a threshold amount.

DETAILED DESCRIPTION

The following describes an example of a process according to the invention. A semiconductor wafer, e.g. silicon, Gallium Arsenide, Silicon-Germanium alloy, Silicon on insulator, etc. is prepared according to the requirements of the circuit being fabricated and the technology in use.

Figure 1:
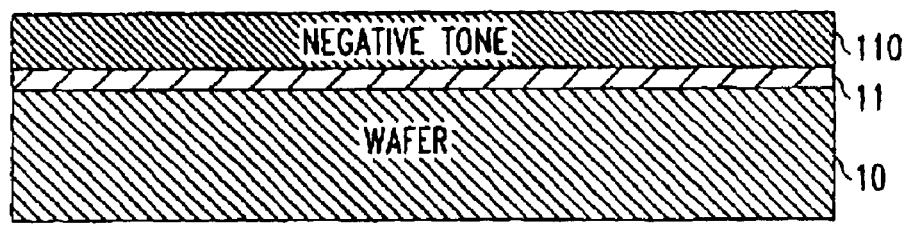
FIG. 1 shows a cross section of a wafer prepared for the invention after coating of the negative resist blocking layer.

A substrate or integrated circuit wafer 10 has a layer 11 on top that represents schematically the pad nitride, pad oxide, and other preliminary layers, as shown in FIG. 1. The dimensions in the Figures are not to scale. In the case of a three hundred millimeter diameter wafer, the relative proportion of the blocking material to be formed at the rim to be defined, the thickness of the material and the diameter of the wafer will be as discussed below. The dimensions shown in the drawing are selected for convenience in presentation and explanation.

A thick layer of negative photoresist 110 has been spun-on and prepared conventionally to be exposed and developed. The exposure dose will be the standard dose for that particular resist.

Figure 2:
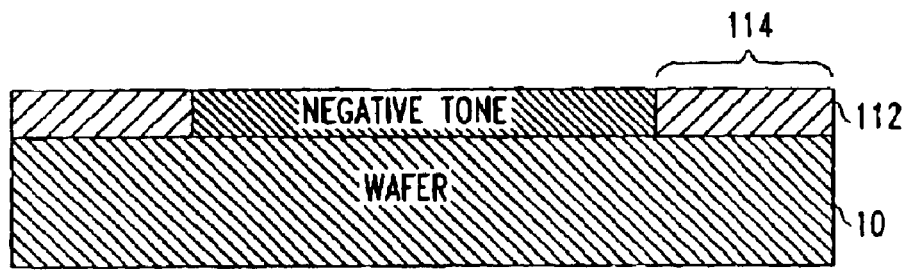
FIG. 2 shows the same area after exposure of the blocking layer.

Next, as shown in FIG. 2, photoresist 110 is exposed at the rim over a radial distance 114 to define a rim 112 that goes around the outer edge of wafer 10. The distance 114 will, in general not be uniform, as discussed below.

Figure 3:
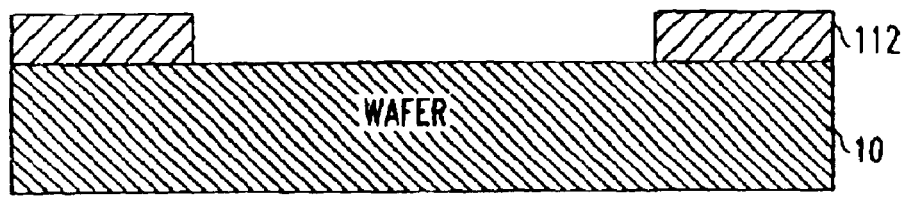
FIG. 3 shows the area after development of the resist material of the blocking layer.

FIG. 3 shows the result of developing the photoresist, in which the central part is removed and the exposed part remains as a layer of blocking material in a blocking area, defining a central inner area inside the blocking area for the construction of the integrated circuits.

Figure 4:
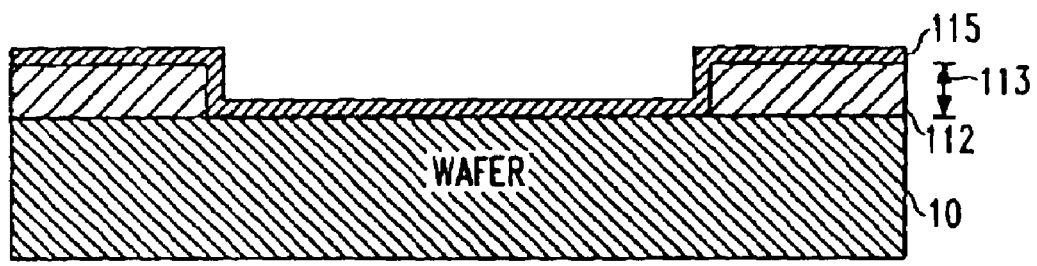
FIG. 4 shows the area after deposition of a patterning photoresist.

FIG. 4 shows the same area after deposition of a layer 115 that represents schematically a patterning photoresist that will be patterned by exposing it with the pattern of opaque and transparent areas in the next etching step and also represents an optional hardmask layer, such as nitride, that can be etched through the openings in the photoresist. Care should be taken to use different layers 112 and 115 when there is a potential problem of undesired intermixing. The pattern to be developed in resist 115 is referred to as the component pattern. A hardmask is not always required and is used when the etching process is more aggressive or lasts for a long time, so that photoresist alone is not enough to withstand the effects of the etching material.

In FIG. 4, the arrow on the right side of the figure represents the difference in height between the resist 115 on top of blocking material 112 and the resist in the central portion of the wafer. In current technology, the depth of focus of the high numerical aperture lenses that are used in optical exposure tools is very small. It does not take a large difference in height 113, therefore, to place the portion of photoresist 115 at a height such that the image of a trench is defocused sufficiently that the light intensity is below the threshold of the resist—i.e. so that the image in the raised portion of resist 115 does not develop. The foregoing assumes that the focusing system of the exposure tool has been configured appropriately such as to suppress automatic focus adjustment in the rim portion of the resist pattern.

Since the resist 115 in that raised region does not develop, no patterns will be formed in that region and the mask (either the resist or the hardmask contained in layer 115) protects the silicon in that area from etching.

The thickness of layer 112 will preferably be such that the thickness of the blocking material will be greater than approximately 1 micron after development. The typical depth of focus of a state of the art trench pattern process is of the order of 0.5 micron and therefore positions the patterning resist 115 out of the focus range of the image; i.e. when an image is in focus on resist in the central portion, the corresponding image will be out of focus on the rim. It should be noted that the numbers given above reflect present (as of the date of this invention) trench patterning process capability and may vary depending on the particular process implemented.

Figure 5:
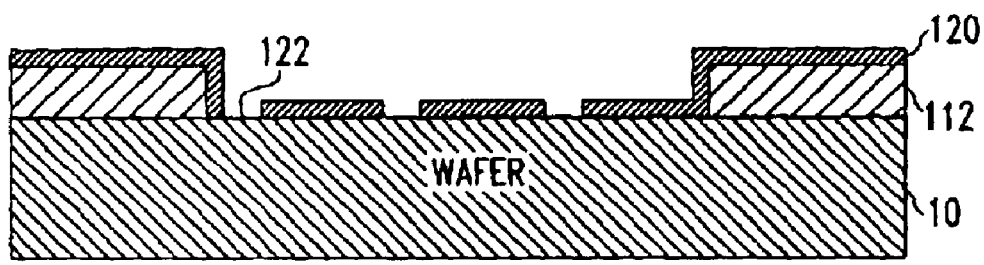
FIG. 5 shows the area after image formation the patterning layer.

Continuing with FIG. 5, the same region is shown after the development step of developing resist 115, with apertures 122 (representing individual trench patterns in resist) in the developed resist 120. The wafer is now ready for the etching step.

Figure 6:
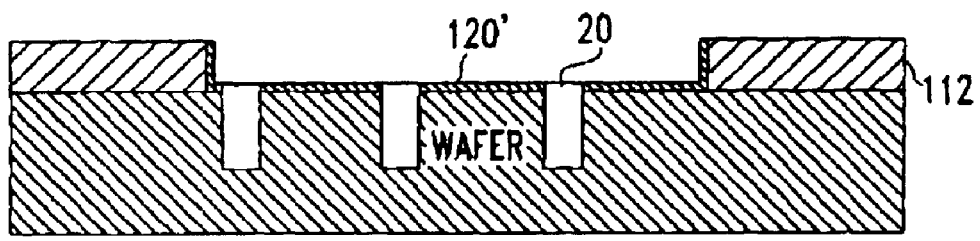
FIG. 6 shows the area after etching a set of deep trenches.

FIG. 6 shows the area after the completion of the deep trench etching step. Trenches 20 have been formed in the desired locations, with the locations between the trenches being protected by the protective layer 120, as is the raised portion of the wafer at the rim.

During the etch process layer 120 is partially removed in the center portion of the wafer (shown as layer 120') but completely removed at the edge. The additional layer 112 prevents etch erosion in this portion of the wafer.

The layers 120 and 112 will be stripped when no longer needed or when a chemical-mechanical polishing or other planarization step is to be performed.

New layers 112 may be formed as needed, though the deep trench represents the heaviest load on the wafer, since it is the longest etching process.

The blocking layer can be applied in a single coating track, comprising coating modules, chill plates, bake plates and in one embodiment of this invention a commercially available edge exposure module (commonly referred to as WEE) in conjunction with post exposure bake plates and develop modules. For the embodiments shown in FIG. 7 an additional exposure tool is required. The embodiment shown on the left side of FIG. 7 can be implemented in a maskless process on a standard exposure tool exposing the rim pattern 706. The embodiment on the right side of FIG. 7 requires a masked process.

Coating of layer 115 is done in standard fashion using coat modules, bakeplates, develop modules. Undesirable intermixing of materials 115 and 111 is avoided by their proper selection. Patterning of layer 115 is accomplished in the standard fashion implemented for this layer (stepper or scanner, 248 nm, 193 nm etc. depending on the technology being used).

Preferably, an extra track will be used to complete step 3 (FIG. 3) since the wafers have to be sent through a develop module, so that the track process is completely finished before step 4 can be done.

Figure 8:
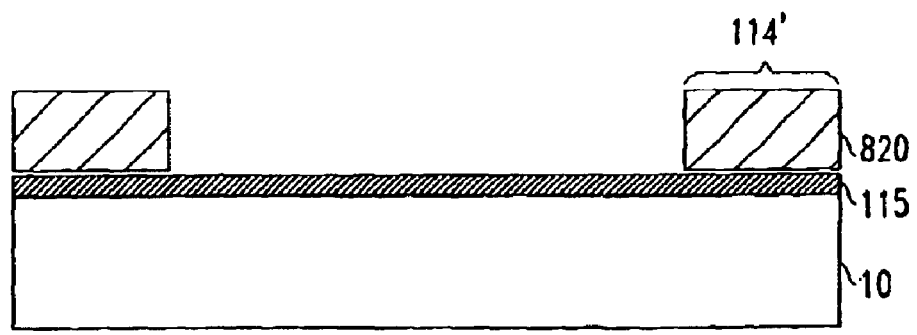
FIG. 8 shows a cross section of a prior art approach to the problem.

Referring now to FIG. 8, there is shown in cross section a prior art approach to protecting the wafer edge during etching. A mechanical ring 820, made of stainless steel or another material that will withstand the etchant gases is positioned above the rim of wafer 10, covering a radial distance 114' and separated from the photoresist 115 by a space. The ring 820 is placed in position after the wafer is prepared with photoresist 115 and remains in position during the etching step, so that the etching gases do not attack the resist 115. The resist 115 underneath the ring has been developed (with a pattern not shown) because the area at the edge of the wafer was exposed in order to improve the uniformity of heat loading during the etch. Thus, there are apertures for trenches in the photoresist at the wafer edge that would be attacked and etched if the ring were not present. The material of the ring will affect the electric field during the etch process, which will have an undesirable effect on the etching uniformity near the ring.

Figure 9:
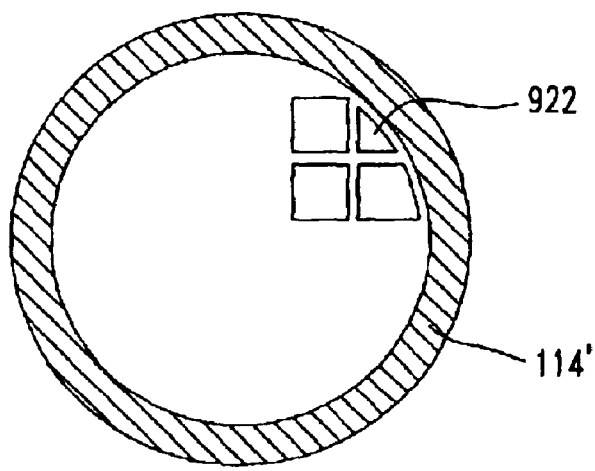
FIG. 9 shows a top view of the prior art approach of FIG. 8.

FIG. 9 shows a top view of the arrangement of FIG. 8. There, it can be seen that the ring is a uniform piece of material that covers part of some chip patterns 922 at the edge of the wafer (3 to 5 mm from the edge of the wafer in current technology).

Figure 7:
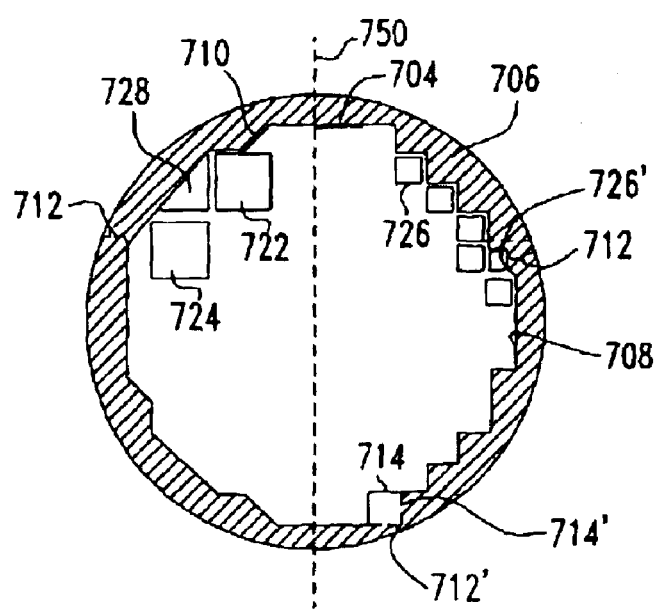
FIG. 7 shows a top view of a wafer using the invention, in two embodiments.

FIG. 7 shows a corresponding top view of a wafer processed according to the invention. The wafer is divided in half with a dashed vertical line 750 in order to illustrate two embodiments of the invention. On the right, the tool that exposes material 115 does not have the capability of exposing an area having a 45 degree line (or other diagonal lines) as an edge; i.e. it can only define vertical lines 708 and horizontal lines 704. Accordingly, the blocking area 706 comes to the edge of the chips 726. If desired, the area 706 could be defined to approach the wafer edge up to a minimum distance 712 shown on the right side of the wafer, with a partial chip 726' filling the gap between the nearest full chip 726 and the blocking area, which would increase the area that is patterned up to a maximum and approach the wafer edge more uniformly than if partially exposed chip patterns were not used.

At the lower portion of the Figure, a line 714 is shown as an alternative to a line 714'. The line 714' would come too close to the wafer edge—i.e. the distance between the wafer edge and the closes chip, denoted as 712', would be too small if a full chip were patterned along line 714'. This location would have a more uniform heat load if a partial chip were used, similar to that shown on the right side of the Figure.

On the left side of the figure, the exposing tool is assumed to have a 45 degree capability, so that diagonal lines 710 can be drawn and the tool has the capability of drawing a first set of edges at right angles and a second set at an acute angle (e.g. 45 degrees) with respect to some of the first set. Other tools may be able to draw other angled lines. This capability permits a closer approach to the wafer rim in various locations and can permit the exposure of a complete chip in some instances, and permit the more uniform exposure of partial chips (and thus more uniform heat loading) in other cases. Such a partial chip 728 is indicated at the left side of the Figure, along with whole chips 722 and 724. The partial exposure arises from the fact that the portion of the chip residing over the rim 712 is out of focus. Two different sizes of chips are shown for purposes of illustration.

An alternative exposure tool to a stepper is flood exposure using a proximity mask protecting the center portion of the wafer, thus printing a pattern like that shown in FIG. 9 (in case a negative resist is used) or the inverted mask when using a positive resist. A mechanical handling tool to place a mask in place in the center of the wafer and expose the photoresist at the rim would cost much less than a stepper, while still providing adequate alignment.

As another alternative, a laser of appropriate wavelength to expose the resist 115 could be positioned to strike the wafer edge while the wafer was rotated underneath it (or a laser could be positioned to rotate in a circle around the rim of a stationary wafer). Commercially available tools used for a different purpose may be used with such an embodiment of the invention.

Suitable candidates for blocking material 115 include commercially available negative tone photoresist and related materials or positive resists. If a positive resist is used, the central area will be exposed, leaving the undeveloped resist at the rim.

An exposure tolerance for material 112 (i.e. a tolerable variation in the inner radius of material 112) is 0.1 mm in contemporary technology. The primary consideration is not the precision of location, since this alignment is non-critical, but the amount of area that cannot be printed with entire chips because of the need to allow for a margin of safety so that a production chip is not ruined by being projected on to the edge of blocking material 112.

While the invention has been described in terms of a single preferred embodiment, those skilled in the art will recognize that the invention can be practiced in various versions within the spirit and scope of the following claims.

What is claimed is:

1. A method of manufacturing a set of integrated circuits on a wafer comprising the steps of:

preparing an integrated circuit substrate;

depositing a layer of photosensitive material having a blocking thickness over said wafer;

exposing said photosensitive material to leave developed material in a blocking area at the outer edge of said wafer;

developing said photosensitive material to leave a layer of blocking material in said area;

depositing a layer of patterning photoresist on said wafer;

exposing said layer of patterning photoresist inside said blocking area with a set of images of a component pattern of a component of said integrated circuit;

etching said wafer through said component pattern; and continuing with processing said integrated circuit.

2. A method according to claim 1, in which said blocking material has a thickness such that said images of said component pattern over said blocking area are out of focus when corresponding images of said component pattern inside said blocking area are in focus, so that said images of said component pattern over said blocking area are not developed.

3. A method according to claim 2, in which said photosensitive material is disposed over a layer of etch-resistant material.

4. A method according to claim 2, in which said photosensitive material is negative tone photoresist.

5. A method according to claim 2, in which said blocking area has an inner boundary comprising only edges at right angles.

6. A method according to claim 2, in which said blocking area has an inner boundary comprising a first set of edges at right angles and a second set of edges oriented at an acute angle with respect to said first set.

7. A method according to claim 1, in which said images of said component pattern are images of deep trench apertures in DRAM cells.

8. A method according to claim 1, in which said photosensitive material is disposed over a layer of etch-resistant material.

9. A method according to claim 1, in which said photosensitive material is negative tone photoresist.

10. A method according to claim 1, in which said blocking area has an inner boundary comprising only edges at right angles.

11. A method according to claim 1, in which said blocking area has an inner boundary comprising a first set of edges at right angles and a second set of edges oriented at forty-five degrees with respect to said first set.

12. A method of etching a set of apertures an a workpiece comprising the steps of:

depositing a layer of photosensitive material having a blocking thickness over said workpiece;

exposing said photosensitive material in a blocking area at the outer edge of said workpiece;

developing said photosensitive material to leave a layer of blocking material in said area;

depositing a layer of patterning photoresist on said workpiece;

exposing said layer of patterning photoresist inside said blocking area with a set of images of said set of apertures; and etching said workpiece through said component pattern.

13. A method according to claim 12, in which said blocking material has a thickness such that said images of said set of apertures over said blocking area are out of focus when corresponding images of said set of apertures inside said blocking area are in focus, so that said images of said set of apertures over said blocking area are not developed.

14. A method according to claim 13, in which said photosensitive material is negative tone photoresist.

15. A method according to claim 12, in which said images of said component pattern are images of deep trench apertures in DRAM cells.

16. A method according to claim 12, in which said photosensitive material is negative tone photoresist.

17. A method according to claim 12, in which said blocking area has an inner boundary comprising only edges at right angles.

18. A method according to claim 12, in which said blocking area has an inner boundary comprising a first set of edges at right angles and a second set of edges oriented at forty-five degrees with respect to said first set.

* * * * *